(12) United States Patent
Em

(10) Patent No.: US 10,083,750 B2
(45) Date of Patent: Sep. 25, 2018

(54) SEMICONDUCTOR MEMORY APPARATUS FOR ADJUSTING VOLTAGE LEVEL OF GLOBAL WORD LINE, AND OPERATING METHOD THEREOF

(71) Applicant: SK hynix Inc., Icheon-si, Gyeonggi-do (KR)

(72) Inventor: Ho Seok Em, Hwaseong-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/471,207

(22) Filed: Mar. 28, 2017

(65) Prior Publication Data

US 2018/0061493 A1 Mar. 1, 2018

(30) Foreign Application Priority Data

Aug. 25, 2016 (KR) .................. 10-2016-0108452

(51) Int. Cl.
*G11C 13/00* (2006.01)

(52) U.S. Cl.
CPC ........ *G11C 13/0069* (2013.01); *G11C 13/004* (2013.01); *G11C 13/0007* (2013.01); *G11C 13/0026* (2013.01); *G11C 13/0028* (2013.01); *G11C 13/0038* (2013.01); *G11C 2013/0054* (2013.01)

(58) Field of Classification Search
CPC ............ G11C 13/0069; G11C 13/0038; G11C 13/0026; G11C 13/004; G11C 13/0007; G11C 13/0028; G11C 2013/0054
See application file for complete search history.

(56) References Cited

U.S. PATENT DOCUMENTS

| | | | | |
|---|---|---|---|---|
| 6,862,213 B2* | 3/2005 | Hamaguchi | ......... | G11C 11/5685 365/148 |
| 7,190,607 B2* | 3/2007 | Cho | .................. | G11C 13/0004 365/148 |
| 7,515,461 B2* | 4/2009 | Happ | .................. | G11C 11/5678 365/148 |
| 7,535,756 B2* | 5/2009 | Lung | .................. | G11C 11/5678 365/148 |
| 7,920,405 B2* | 4/2011 | Kang | ..................... | B82Y 10/00 365/148 |
| 8,582,353 B2* | 11/2013 | Lee | ..................... | G11C 11/1675 365/158 |
| 8,675,423 B2* | 3/2014 | Dodge | ............... | G11C 13/0004 365/148 |
| 8,879,311 B2 | 11/2014 | Pyeon | | |
| 9,076,523 B2* | 7/2015 | Lee | .................... | G11C 13/0002 |
| 9,514,813 B2* | 12/2016 | Lee | .................... | G11C 13/0069 |
| 2015/0049536 A1* | 2/2015 | Oh | ........................ | G11C 13/003 365/148 |

* cited by examiner

*Primary Examiner* — Vanthu Nguyen
(74) *Attorney, Agent, or Firm* — William Park & Associates Ltd.

(57) ABSTRACT

A semiconductor memory apparatus may include a memory cell, a write driver, and a voltage adjustment circuit. The write driver may provide the memory cell with a program current based on a write data. The voltage adjustment circuit may adjust a voltage level of a global word line coupled to the memory cell when a current flowing through the memory cell or the voltage level of the global word line is greater than a threshold value.

16 Claims, 9 Drawing Sheets

US 10,083,750 B2

SEMICONDUCTOR MEMORY APPARATUS FOR ADJUSTING VOLTAGE LEVEL OF GLOBAL WORD LINE, AND OPERATING METHOD THEREOF

CROSS-REFERENCES TO RELATED APPLICATION

The present application claims priority under 35 U.S.C. § 119(a) to Korean application number 10-2016-0108452 filed on Aug. 25, 2016 in the Korean Intellectual Property Office, which is incorporated herein by reference in its entirety.

BACKGROUND

1. Technical Field

Various embodiments generally relate to a semiconductor technology, and more particularly to a semiconductor memory apparatus and an operating method thereof.

2. Related Art

An electronic device includes a lot of electronic elements, and a computer system includes lots of electronic elements such as semiconductor based electronic elements. In computer architecture, a dynamic random access memory (DRAM) is widely used as a main memory since the DRAM has the advantage of fast data input/output speed and random access. However, the DRAM stores each bit of data in a memory cell consisting of a capacitor and a transistor, and because of capacitor leakage current, the DRAM loses stored data when power supply is cut off. By contrast, a flash memory storing data in a floating gate or a charge trap layer can retain stored data even when power supply is cut off. However, the flash memory has a slower data input/output speed than the DRAM.

Recently, the emerging next-generation memory technologies such as Phase-Change Random Access Memory (PCRAM), Resistive Random Access Memory (RRAM), Magnetic Random Access Memory (MRAM), and Ferroelectric Random Access Memory (FRAM) are expected to replace the traditional memory technologies in several areas. Some of the next-generation memory technologies are expected to replace the traditional non-volatile memory technologies because they can achieve the high-speed requirement. Particularly, the PRAM storing data in chalcogenide layers by changing their resistance values is regarded as the most promising next-generation memory.

SUMMARY

In an embodiment of the present invention, a semiconductor memory apparatus may include a write driver, a transition detection circuit, and a voltage adjustment circuit. The write driver may provide a memory cell with a program current based on a write data. The transition detection circuit may generate a detection signal by comparing one of a current flowing through the memory cell and a voltage level of a global word line coupled to the memory cell with a reference value. The voltage adjustment circuit may adjust the voltage level of the global word line based on the detection signal.

In an embodiment of the present invention, an operating method of a semiconductor memory apparatus including a memory cell may include providing a global word line with a power bias voltage during an active mode of the semiconductor memory apparatus. The operating method may include providing a program current to the memory cell based on a write data. The operating method may also include adjusting a voltage level of the global word line based on a current flowing through the memory cell and the voltage level of the global word line.

DETAILED DESCRIPTION

Hereinafter, a semiconductor apparatus according to an embodiment of the present invention will be described below with reference to the accompanying drawings.

Figure 1:
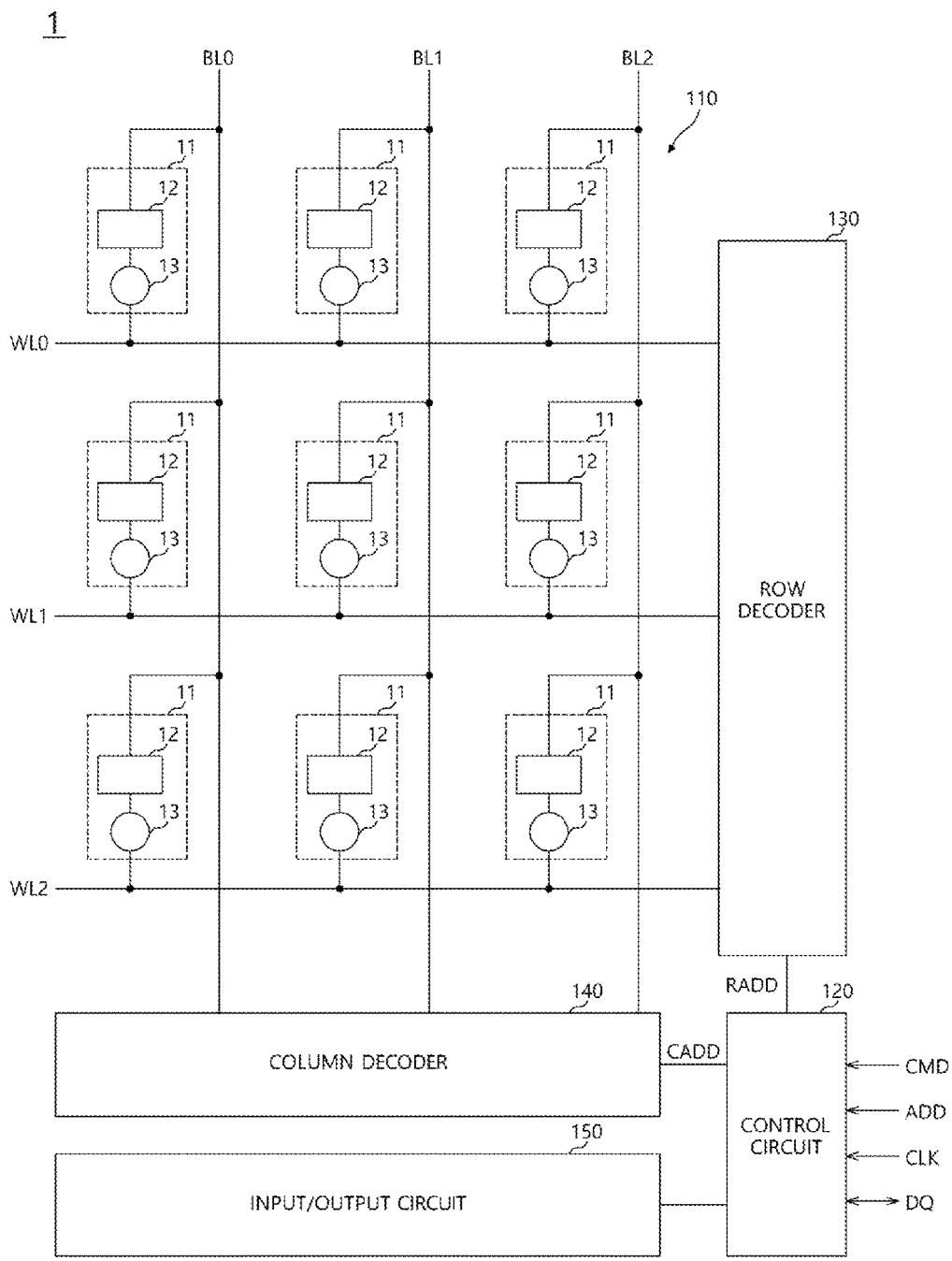
FIG. 1 is a diagram illustrating an example of a semiconductor memory apparatus in accordance with an embodiment.

FIG. 1 is a diagram illustrating an example of a semiconductor memory apparatus 1 in accordance with an is embodiment. Referring to FIG. 1, the semiconductor memory apparatus 1 may include a memory cell array 110, a control circuit 120, a row decoder 130, a column decoder 140, and an input/output circuit 150. The memory cell array 110 may include a plurality of memory cells 11 located at cross-points of a plurality of word lines WL0, WL1 and WL2 and a plurality of bit lines BL0, BL1 and BL2. Each of the plurality of memory cells 11 may include a phase-change element 12 and a switching element 13. The phase-change element 12 may be coupled to the bit line BL0, BL1 and BL2 at one end thereof, and may be coupled to the switching element 13 at the other end thereof. The switching element 13 may be coupled to the other end of the phase-change element 12 at one end thereof, and may be coupled to the word line WL0, WL1 and WL2 at the other end thereof. The phase-change element 12 may store "set" data and "reset" data. For example, the phase-change element 12 may enter a high-resistance state to store the reset data and enter a low-resistance state to store the set data. The switching element 13 may be the Ovonic Threshold Switch (OTS). The switching element 13 may be turned on when a voltage difference between both ends thereof is greater than a threshold value or a current flowing through the switching element 13 is greater than a threshold value. When the switching element 13 is turned on, a great amount of current may flow through the switching element 13.

The control circuit 120 may control the operation of the semiconductor memory apparatus 1 by communicating with an external device (not illustrated). The external device may be a host device that includes a processor and a memory controller. For example, the control circuit 120 may receive a command signal CMD, an address signal ADD, and a clock signal CLK. The control circuit 120 may receive data DQ and output the data DQ. The control circuit 120 may control each of the row decoder 130, the column decoder 140, and the input/output circuit 150 based on the command signal CMD and the address signal ADD. Based on the command signal CMD and the address signal ADD, the control circuit 120 may provide a row address signal RADD to the row decoder 130, and may provide a column address signal CADD to the column decoder 140. The row decoder 130 may select a particular word line based on the row address signal RADD, and the column decoder 140 may select a particular bit line based on the column address signal CADD. When the particular word line and the particular bit line are selected, the memory cell 11 coupled to the particular word line and the particular bit line may be accessed.

Although not illustrated, the memory cell array 110 of the semiconductor memory apparatus 1 may have hierarchical bit line structure and hierarchical word line structure. For example, each of the plurality of bit lines BL0, BL1 and BL2 may be coupled to a global bit line through a column switch, and each of the plurality of word lines WL0, WL1 and WL2 may be coupled to a global word line through a row switch.

The semiconductor memory apparatus 1 may perform write operation and read operation. The write operation may include storing data DQ provided from the external device into the memory cell array 110, and may be a program operation. The read operation may include outputting data stored in the memory cell array 110 to the external device. The control circuit 120 may control the semiconductor memory apparatus 1 to perform the write operation and the read operation based on the command signal CMD. The input/output circuit 150 may include a write driver (not illustrated) and a read sense amplifier (not illustrated). During the write operation of the semiconductor memory apparatus 1, the write driver may provide a program current to the memory cell array 110 based on write data. Here, the write data represents data to be written in the memory cell array 110. The write driver may provide the memory cell array 110 with a set program current to program the "set" data, and may provide the memory cell array 110 with a reset program current to program the "reset" data. During the read operation of the semiconductor memory apparatus 1, the read sense amplifier may output data stored in the memory cell array 110. The data output from the read sense amplifier may be output to the external device through the control circuit 120.

Figure 2:
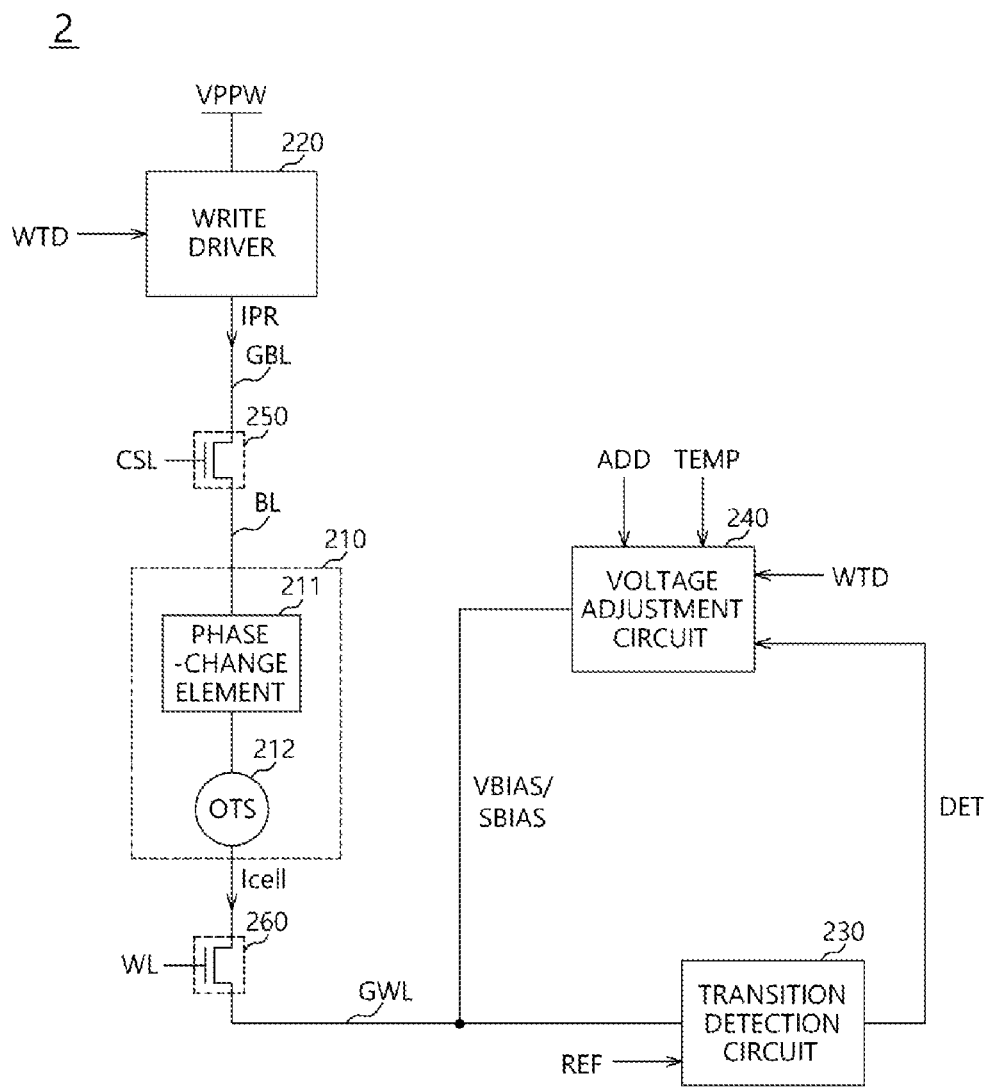
FIG. 2 is a diagram illustrating an example of a semiconductor memory apparatus in accordance with an embodiment.

FIG. 2 is a diagram illustrating an example of a semiconductor memory apparatus 2 in accordance with an embodiment. Referring to FIG. 2, the semiconductor memory apparatus 2 may include a memory cell 210, a write driver 220, a transition detection circuit 230, and a voltage adjustment circuit 240. The memory cell 210 may include a phase-change element 211 and a switching element 212. Here, the switching element 212 may be the Ovonic Threshold Switch (OTS). The memory cell 210 may be coupled to the write driver 220 at one end thereof, and may be coupled to a global word line GWL at the other end thereof. Referring to FIG. 2, the semiconductor memory apparatus 2 may further include a column switch 250 and a row switch 260. The column switch 250 may couple a global bit line GBL to a bit line BL based on a column selection signal CSL. The row switch 260 may be coupled to a word line WL, and may couple the memory cell 210 to the global word line GWL when the word line WL is enabled. The memory cell 210 may be coupled at one end thereof to the bit line BL, and to the global bit line GBL and the write driver 220 through the column switch 250. The memory cell 210 may be coupled at the other end thereof to the global word line GWL through the row switch 260.

The write driver 220 may provide the memory cell 210 with a program current IPR. The write driver 220 may receive write data WTD, and may generate the program current IPR corresponding to the write data WTD. The write data WTD may be one of "set" data and "reset" data. For example, the write data WTD may be a code corresponding to one of "set" data and "reset" data. However, the write driver 220 may generate the program current IPR corresponding to various values of multi-level data when the memory cell 210 is capable of storing the multi-level data. The memory cell 210 may provide the program current IPR to the global bit line GBL.

Figure 3:
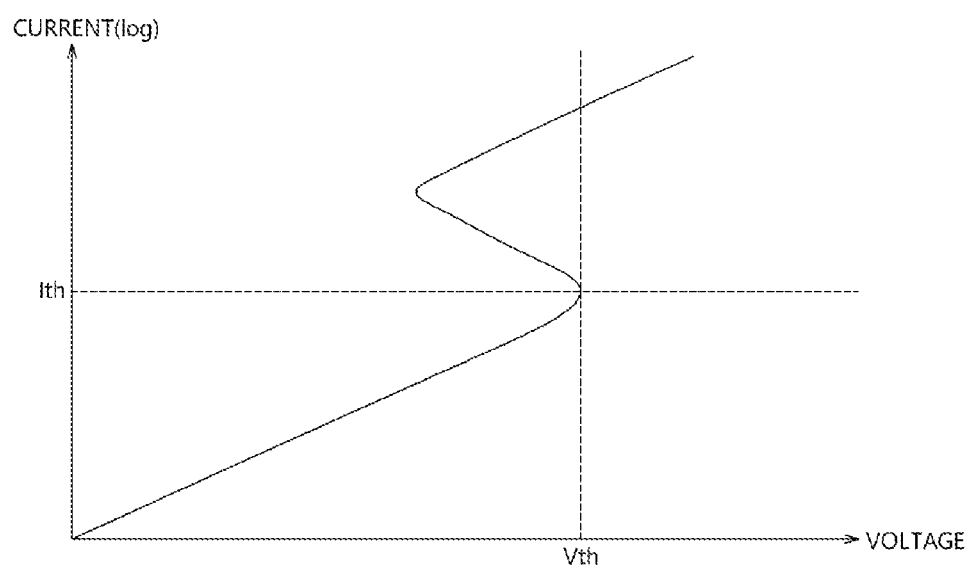
FIG. 3 is a current-voltage graph illustrating a characteristic of a memory cell of FIG. 2.

The transition detection circuit 230 may be coupled to the memory cell 210 through the global word line GWL, and may receive a current Icell flowing through the memory cell 210. When the current Icell flowing through the memory cell 210 is greater than a threshold current value or when a voltage difference between both ends of the memory cell 210 is greater than a threshold voltage value, the switching element 212 may be turned on, and thus a great amount of current may flow through the memory cell 210. For example, the switching of the switching element 212 may cause a drastic increase in the current flowing through the memory cell 210. FIG. 3 is a current-voltage graph illustrating a characteristic of the memory cell 210 of FIG. 2. Referring to FIG. 3, the horizontal axis of the graph represents a voltage difference between the two ends of the switching element 212, and the vertical axis of the graph represents a log scale of a current flowing through the switching element 212. The switching element 212 may stay turned off while a current flowing through the switching element 212 is smaller than a threshold current value Ith or while a voltage difference between both ends of the switching element 212 is smaller than a threshold voltage value Vth. Therefore, an amount of current flowing through the memory cell 210 may be very small. When the current flowing through the switching element 212 becomes greater than the threshold current value Ith or when a voltage difference between both ends of the switching element 212 becomes greater than the threshold voltage value Vth as the current flowing through the memory cell 210 increases, the switching element 212 may be turned on. When the switching element 212 is turned on, an unlimited amount of current may flow through the memory cell 210.

The transition detection circuit 230 may generate a detection signal DET by detecting whether or not the switching element 212 is turned on. The transition detection circuit 230 may generate the detection signal DET by comparing the current Icell flowing through the memory cell 210 with a reference value REF. The reference value REF may be a current value corresponding to the threshold current value Ith or more. When the current Icell flowing through the memory cell 210 increases, a voltage level of the global word line GWL may rise. The transition detection circuit 230 may also generate the detection signal DET by comparing the voltage level of the global word line GWL with the reference value REF. The reference value REF may be a value of a predetermined voltage level. The predetermined voltage level may correspond to the voltage level of the global word line GWL, which rises due to the current Icell flowing through the memory cell 210 when the switching element 212 is turned on. The transition detection circuit 230 may enable the detection signal DET when the current Icell flowing through the memory cell 210 is greater than the threshold current value Ith or when the voltage level of the global word line GWL is greater than the predetermined voltage level. The transition detection circuit 230 may not enable the detection signal DET when the current Icell flowing through the memory cell 210 is smaller than the threshold current value Ith or the voltage level of the global word line GWL is smaller than the predetermined voltage level.

The voltage adjustment circuit 240 may adjust the voltage level of the global word line GWL. The voltage adjustment circuit 240 may apply one of a variable bias voltage VBIAS and a power bias voltage SBIAS to the global word line GWL. For example, the voltage adjustment circuit 240 may select one between the variable bias voltage VBIAS and the power bias voltage SBIAS based on the detection signal DET. When the detection signal DET is disabled, the voltage adjustment circuit 240 may provide the power bias voltage SBIAS to the global word line GWL. Here, the power bias voltage SBIAS may have a negative voltage level such as a substrate bias voltage or a bulk bias voltage. When the detection signal DET is enabled, the voltage adjustment circuit 240 may provide the variable bias voltage VBIAS to the global word line GWL. The voltage s adjustment circuit 240 may generate the variable bias voltage VBIAS based on the write data WTD. As described above, the write data WTD may be either the set data or the reset data. The voltage adjustment circuit 240 may generate the variable bias voltage VBIAS having different levels according to whether the write data WTD is the set data or the reset data. For example, the voltage adjustment circuit 240 may generate the variable bias voltage VBIAS having higher level when the write data WTD is the set data than the level of the variable bias voltage VBIAS generated when the write data WTD is the reset data. The variable bias voltage VBIAS may have a negative voltage level that is higher than the level of the power bias voltage SBIAS.

The voltage adjustment circuit 240 may further receive an address signal ADD and temperature information TEMP. The address signal ADD may represent a location of the memory cell 210 in a memory cell array. The voltage adjustment circuit 240 may further adjust the level of the variable bias voltage VBIAS based on the address signal ADD. For example, the further apart the memory cell 210 is spaced from the write driver 220, the lower the variable bias voltage VBIAS applied to the memory cell 210. The voltage adjustment circuit 240 may apply the variable bias voltage VBIAS at a lower level to the memory cell 210 located remotely from the write driver 220, and may apply the variable bias voltage VBIAS at a higher level to the memory cell 210 located near the write driver 220.

The temperature information TEMP may represent a s temperature of the semiconductor memory apparatus 2. Operation characteristics of the semiconductor memory apparatus 2 may vary according to a temperature. For example, an amount of the program current IPR used to write the write data WTD into the memory cell 210 at a higher temperature may be smaller than the amount of the program current IPR used to write the write data WTD into the memory cell 210 at a lower temperature. During the program operation of the write data WTD into the memory cell 210, the lower the temperature of the semiconductor memory apparatus 2 becomes, the greater amount of the program current IPR the semiconductor memory apparatus 2 requires to perform a program operation. Therefore, the voltage adjustment circuit 240 may increase the level of the variable bias voltage VBIAS when the temperature of the semiconductor memory apparatus 2 is high, and may decrease the level of the variable bias voltage VBIAS when the temperature of the semiconductor memory apparatus 2 is low.

When the semiconductor memory apparatus 2 writes the write data WTD into the memory cell 210, the voltage adjustment circuit 240 may provide the power bias voltage SBIAS to the global word line GWL. The write driver 220 may provide the memory cell 210 with the program current IPR corresponding to the write data WTD. The write driver 220 may generate the program current IPR based on a program voltage VPPW, and the power bias voltage SBIAS may have a sufficiently low level. Here, if a voltage difference between the write driver 220 and the global word line GWL becomes too high, unexpected problems may occur in the durability and reliability of the column switch 250, the memory cell 210, and the row switch 260. Therefore, in accordance with various embodiments of the present disclosure, the semiconductor memory apparatus 2 may determine that the program operation with respect to the memory cell 210 has been completed, and may increase the voltage level of the global word line GWL when it is detected that the current Icell flowing through the memory cell 210 is greater than the threshold current value Ith or when it is detected that the voltage level of the global word line GWL is greater than the predetermined voltage level. The transition detection circuit 230 may enable the detection signal DET when the current Icell flowing through the memory cell 210 or the voltage level of the memory cell 210 is greater than the reference value REF, and the voltage adjustment circuit 240 may provide the global word line GWL with the variable bias voltage VBIAS instead of power bias voltage SBIAS in response to the detection signal DET. Therefore, the voltage level of the global word line GWL may rise, and the voltage difference between the write driver 220 and the global word line GWL may be reduced.

Figure 4:
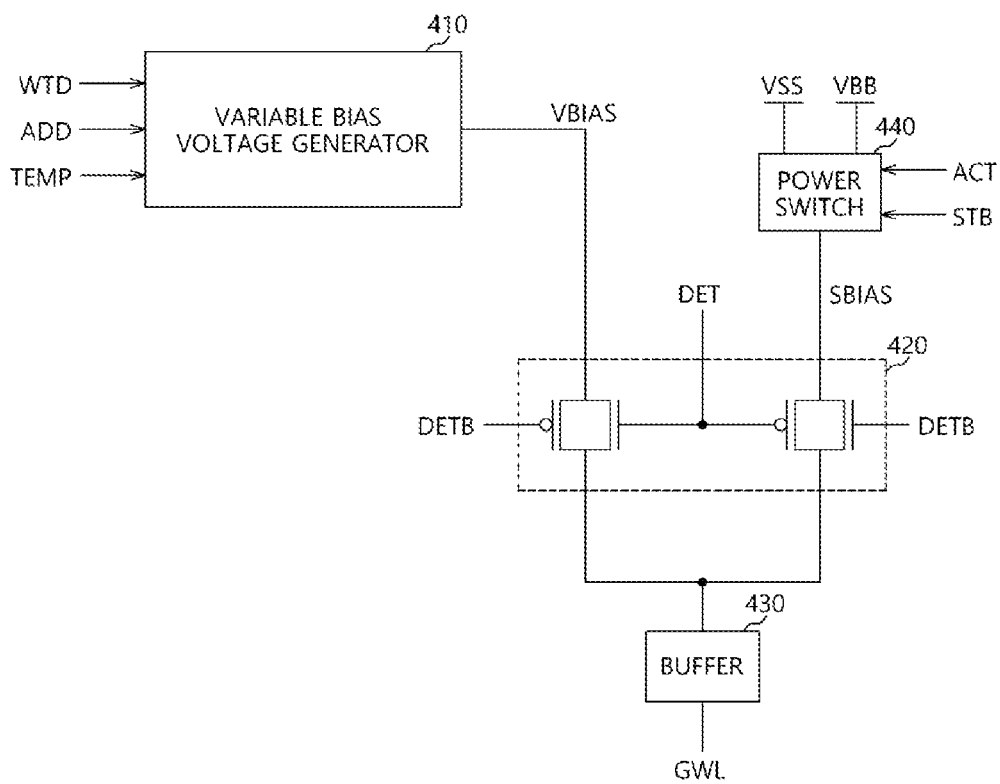
FIG. 4 is a diagram illustrating an example of a voltage adjustment circuit of FIG. 2.

FIG. 4 is a diagram illustrating an example of the voltage adjustment circuit 240 of FIG. 2. Referring to FIG. 4, the voltage adjustment circuit 240 may include a variable bias voltage generator 410, a global word line voltage switch 420, and a buffer 430. The variable bias voltage generator 410 may generate the variable bias voltage VBIAS based on the write data WTD. Further, the variable bias voltage generator 410 may further adjust the level of the variable bias voltage VBIAS based on the address signal ADD and the temperature information TEMP.

The global word line voltage switch 420 may receive the variable bias voltage VBIAS and the power bias voltage SBIAS. The global word line voltage switch 420 may output one of the variable bias voltage VBIAS and the power bias voltage SBIAS in response to the detection signal DET. The global word line voltage switch 420 may include a first pass gate 421 and a second pass gate 422. The first pass gate 421 may receive the variable bias voltage VBIAS, and the second pass gate 422 may receive the power bias voltage SBIAS. The first and second pass gates 421 and 422 may be turned on in response to the detection signal DET and an inverted signal DETB of the detection signal DET. The first pass gate 421 may output the variable bias voltage VBIAS when the detection signal DET is enabled to a high level, and the second pass gate 422 may output the power bias voltage SBIAS when the detection signal DET is disabled to a low level.

The buffer 430 may buffer the output of the global word line voltage switch 420, and may provide the global word line GWL with the buffered voltage. Alternatively, in an example where the voltage adjustment circuit 240 does not include buffer 430, the global word line voltage switch 420 may directly transfer the output signal thereof to the global word line GWL. When the voltage level of the global word line GWL drastically changes from the level of the power bias voltage SBIAS to the level of the variable bias voltage VBIAS, the current Icell flowing through the memory cell 210 may drastically decrease. The buffer 430 may allow the current Icell flowing through the memory cell 210 to gradually decrease by allowing the voltage level of the global word line GWL to gradually increase.

The voltage adjustment circuit 240 may further include a power switch 440. The semiconductor memory apparatus 2 may perform a write operation and a read operation during an active mode. When the semiconductor memory apparatus 2 is not in the active mode, the semiconductor memory apparatus 2 may enter a standby mode to minimize power consumption. The power switch 440 may output a bulk bias voltage VBB as the power bias voltage SBIAS during the active mode of the semiconductor memory apparatus 2, and may output a ground voltage VSS as the power bias voltage SBIAS during the standby mode of the semiconductor memory apparatus 2. The power switch 440 may receive an active signal ACT and a standby signal STB. The active signal ACT may indicate that the semiconductor memory apparatus 2 has entered the active mode, and the standby signal STB may indicate that the semiconductor memory apparatus 2 has entered the standby mode. The power switch 440 may output the bulk bias voltage VBB as the power bias voltage SBIAS when the active signal ACT is enabled, and may output a ground voltage VSS as the power bias voltage SBIAS when the standby signal STB is enabled.

The voltage level of the global word line GWL may change according to the operation of the semiconductor memory apparatus 2. During the standby mode of the semiconductor memory apparatus 2, the voltage adjustment circuit 240 may provide the global word line GWL with the power bias voltage SBIAS corresponding to the ground voltage VSS, and the voltage level of the global word line GWL may become the same voltage level as the ground voltage VSS. When the semiconductor memory apparatus 2 is in the active mode, the voltage adjustment circuit 240 may provide the global word line GWL with the power bias voltage SBIAS corresponding to the bulk bias voltage VBB, and the voltage level of the global word line GWL may become the same voltage level as the bulk bias voltage VBB. When the semiconductor memory apparatus 2 performs a write operation, the program current IPR may be provided to the memory cell 210. At this time, the voltage level of the global word line GWL may stay at the bulk bias voltage VBB. When the switching element 212 of the memory cell 210 is turned on and the current Icell flowing through the memory cell 210 becomes greater than the reference value REF, the detection signal DET may be enabled. Therefore, the voltage adjustment circuit 240 may provide the global word line GWL with the variable bias voltage VBIAS, and the voltage level of the global word line GWL may become the same voltage level as the variable bias voltage VBIAS.

Figure 5:
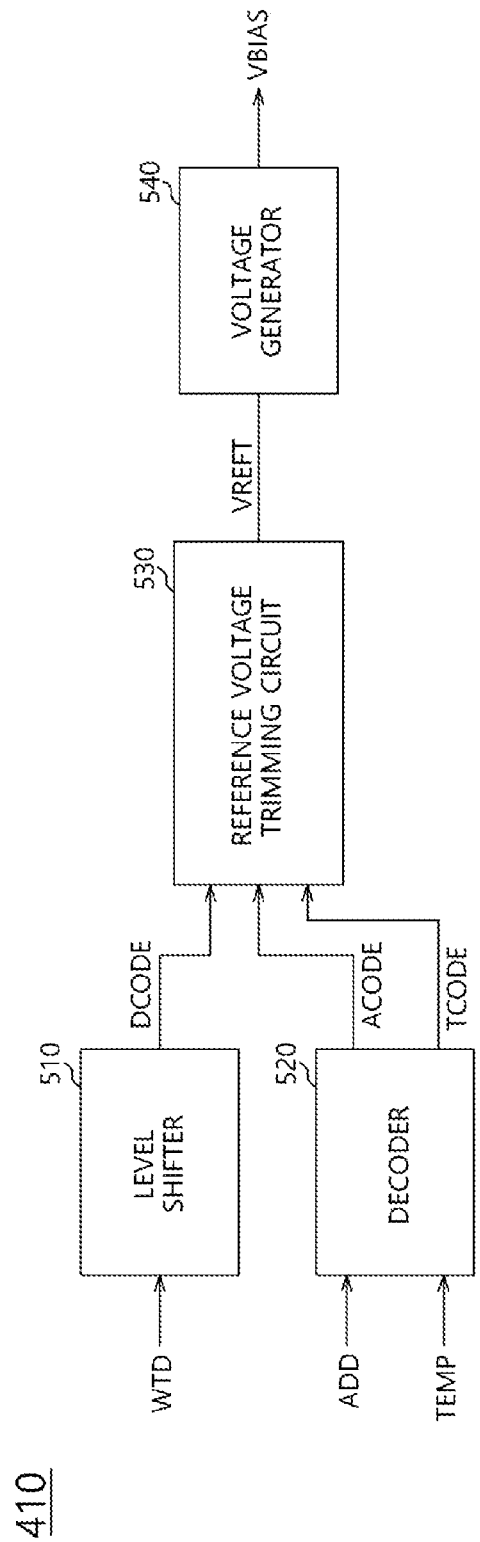
FIG. 5 is a diagram illustrating an example of a variable bias voltage generator of FIG. 4.

FIG. 5 is a diagram illustrating an example of the variable bias voltage generator 410 of FIG. 4. The variable bias voltage generator 410 may be implemented by various logic circuits, and FIG. 5 illustrates an example of the variable bias voltage generator 410. The variable bias voltage generator 410 may include a level shifter 510, a decoder 520, a reference voltage trimming circuit 530, and a voltage generator 540. The level shifter 510 may generate a data trimming code DCODE based on the write data WTD. For example, the write data WTD may be input in the form of a digital code, and the level shifter 510 may generate the data trimming code DCODE by changing a voltage level of the write data code or by decoding the write data code. The decoder 520 may receive the address signal ADD and the temperature information TEMP. The decoder 520 may generate an address trimming code ACODE by decoding the address signal ADD, and may generate a temperature trimming code TCODE by decoding the temperature information TEMP. The reference voltage trimming circuit 530 may generate a reference voltage VREFT based on the data trimming code DCODE, the address trimming code ACODE, and the temperature trimming code TCODE. The reference voltage trimming circuit 530 may include a plurality of serially coupled resistors. The reference voltage trimming circuit 530 may generate the reference voltage VREFT based on the data trimming code DCODE. For example, the reference voltage trimming circuit 530 may select one of a plurality of voltages output from the plurality of serially coupled resistors based on the data trimming code DCODE, the address trimming code ACODE, and the temperature trimming code TCODE, and output the selected voltage as the reference voltage VREFT. The voltage generator 540 may generate the variable bias voltage VBIAS corresponding to the reference voltage VREFT.

Figure 6:
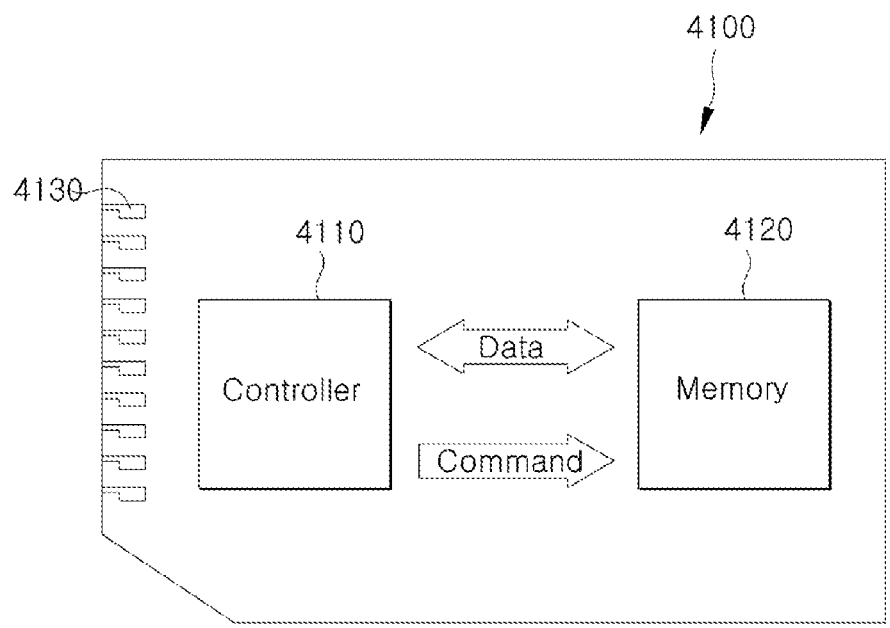
FIG. 6 is a schematic diagram illustrating an example of a memory card 4100 including a semiconductor memory apparatus in accordance with various embodiments.

FIG. 6 is a schematic diagram illustrating an example of a memory card 4100 including a semiconductor memory apparatus in accordance with various embodiments. Referring to FIG. 6, the memory card system 4100 may include a controller 4110, a memory 4120, and an interface member 4130. The controller 4110 and the memory 4120 may exchange a command and/or data. For example, the memory 4120 may be used to store a command that will be executed by the controller 4110, and/or the memory 4120 may be used to store user data.

The memory card system 4100 may store data into the memory 4120 or output data to an external device from the memory 4120. The memory 4120 may include the memory apparatuses 1 and 2 in accordance with various embodiments.

The interface member 4130 may transfer data from/to an external device. The memory card system 4100 may be a multimedia card (MMC), a secure digital card (SD), or a portable data storage device.

Figure 7:
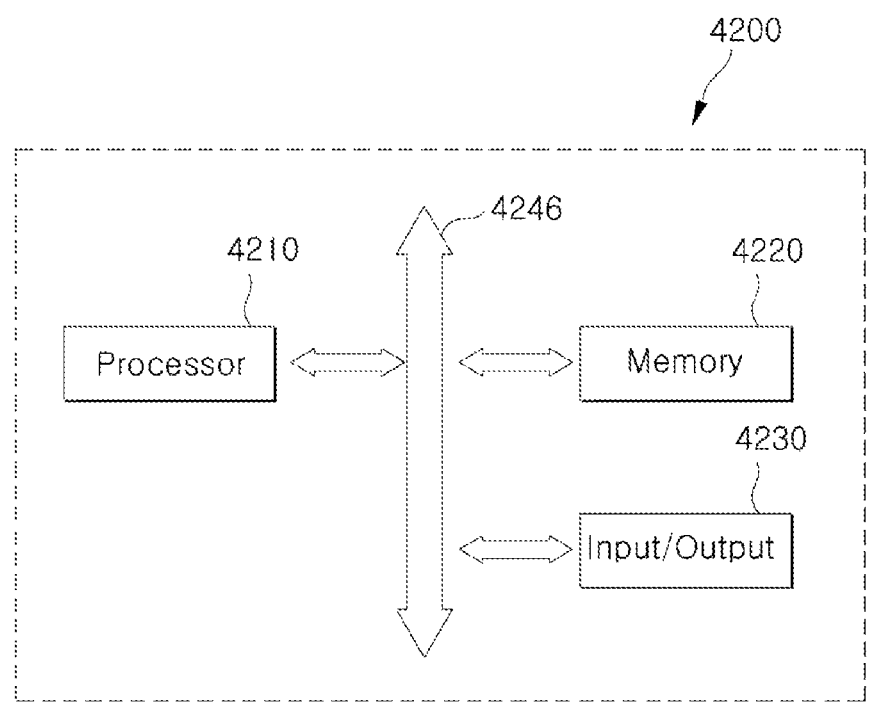
FIG. 7 is a diagram illustrating an example of an electronic device 4200 including a semiconductor memory apparatus in accordance with various embodiments.

FIG. 7 is a diagram illustrating an example of an electronic device 4200 including a semiconductor memory apparatus in accordance with various embodiments. Referring to FIG. 7, the electronic device 4200 may include a processor 4210, a memory 4220, and an input/output device 4230. The processor 4210, the memory 4220 and the input/output device 4230 may be coupled to one another through a bus 4246.

The memory 4220 may receive a control signal from the processor 4210. The memory 4220 may be used to store code and data for the operation of the processor 4210. The memory 4220 may be used to store data that is accessed through the bus 4246. The memory 4220 may include the memory apparatuses 1 and 2 in accordance with various embodiments of the present disclosure. Additional circuits and control signals may be provided for implementations and modifications of the present disclosure.

The electronic device 4200 may be included in various electronic control devices requiring the memory 4220. For example, the electronic device 4200 may be used in a personal digital assistant (PDA), a laptop computer, a portable computer, a web tablet, a wireless phone, a portable phone, a digital music player, a MP3 player, a navigation, a solid state disk (SSD), a household appliance, or any device capable of wireless communication.

Figure 8:
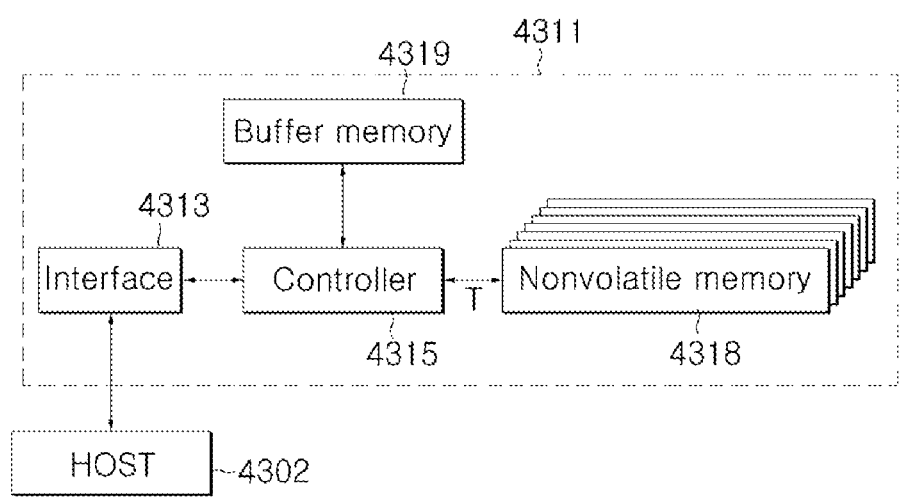
FIG. 8 is a diagram illustrating an example of a data storage device including a semiconductor memory apparatus in accordance with various embodiments.
Figure 9:
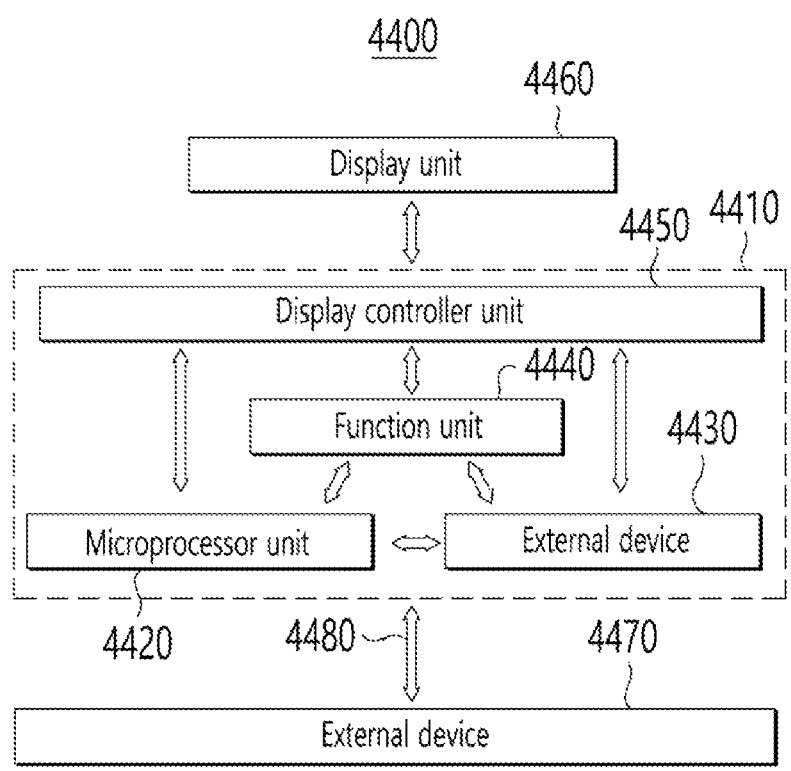
FIG. 9 is a diagram illustrating an example of an electronic system 4400 including a semiconductor memory apparatus in accordance with various embodiments.

With reference to FIGS. 8 and 9, examples of the implementations and modifications of the electronic device 4200 will be discussed here.

FIG. 8 is a diagram illustrating an example of a data storage device including a semiconductor memory apparatus in accordance with various embodiments. Referring to FIG. 8, a data storage device may be provided such as the solid state disk (SSD) 4311. The SSD 4311 may include an interface 4313, a controller 4315, a nonvolatile memory 4318, and a buffer memory 4319.

The SSD 4311 stores data through a semiconductor apparatus. The SSD 4311 has many advantages over the hard disk drive (HDD). The SSD 4311 operates faster and can be made smaller than the HDD. The SSD 4311 does not make noise, and thus can be more reliable compared to the mechanical HDD. The SSD 4311 may be widely used in a notebook PC, a netbook, a desktop PC, a MP3 player, or a portable storage device.

The controller 4315 may be electrically coupled to the interface 4313. The controller 4315 may be a microprocessor including a memory controller and a buffer controller. The nonvolatile memory 4318 may be electrically coupled to the controller 4315 through a connection terminal T. Data storage capacity of the SSD 4311 may correspond to that of the nonvolatile memory 4318. The buffer memory 4319 may be electrically coupled to the controller 4315.

The interface 4313 may be coupled to a host 4302, and may transfer electrical signals such as data signals. For example, the interface 4313 may conform to a protocol such as SATA, IDE, SCSI, and/or combination thereof. The nonvolatile memory 4318 may be coupled to the interface 4313 through the controller 4315.

The nonvolatile memory 4318 may store data provided through the interface 4313. The nonvolatile memory 4318 may include the memory apparatuses 1 and 2 in accordance with various embodiments of the present disclosure. The nonvolatile memory 4318 may retain stored data even when power supply to the SSD 4311 is cut off.

The buffer memory 4319 may include a volatile memory. The volatile memory may be DRAM and/or SRAM. The buffer memory 4319 may operate faster than the nonvolatile memory 4318.

The interface 4313 may process data faster than the nonvolatile memory 4318. The buffer memory 4319 may temporarily store data. Data provided through the interface 4313 may be temporarily stored in the buffer memory 4319, and then may be stored in the nonvolatile memory 4318.

Among data stored in the nonvolatile memory 4318, frequently accessed data may be read in advance from the nonvolatile memory 4318 and temporarily stored in the buffer memory 4319. That is, the buffer memory 4319 may serve to increase effective operation speed of the SSD 4311 and reduce error rate of the SSD 4311.

FIG. 9 is a diagram illustrating an example of an electronic system 4400 including a semiconductor memory apparatus in accordance with various embodiments. Referring to FIG. 9, the electronic system 4400 may include a body 4410, a microprocessor unit 4420, a power unit 4430, a function unit 4440, and a display controller unit 4450.

The body 4410 may be a motherboard formed with the printed circuit board (PCB). The microprocessor unit 4420, the power unit 4430, the function unit 4440, and the display controller unit 4450 may be mounted on the body 4410. A display unit 4460 may be disposed in or outside the body 4410. For example, the display unit 4460 may be disposed on a surface of the body 4410 and display image processed by the display controller unit 4450.

The power unit 4430 may receive a predetermined voltage from an external battery, divide the provided voltage into required voltages of various levels, and provide the divided voltages to the microprocessor unit 4420, the function unit 4440, the display controller unit 4450 and so forth. The microprocessor unit 4420 may receive the divided voltage from the power unit 4430 and may control the function unit 4440 and the display unit 4460. The function unit 4440 may perform various functions of the electronic system 4400. For example, if the electronic system 4400 is a cellular phone, the function unit 4440 may include various element capable of cellular phone functions such as dialling, image output to the display unit 4460 and voice output to a speaker through communication with an external device 4470 and so forth, and may function as a camera image processor when a camera is mounted in the electronic system 4400.

If the electronic system 4400 is coupled to a memory card to expand storage capacity, the function unit 4440 may serve as a memory card controller. The function unit 4440 may exchange signals with the external device 4470 through a wired or wireless communication unit 4480. If the electronic system 4400 requires an external device such as a universal serial bus (USB) storage device to expand functionality, the function unit 4440 may work as an interface controller. The concept of the memory apparatuses 1 and 2 in accordance with various embodiments of the present disclosure may be applied to one or both of the microprocessor unit 4420 and the function unit 4440.

While certain embodiments have been described above, it will be understood to those skilled in the art that the embodiments described are by way of example only. Accordingly, the semiconductor memory apparatus and operating method thereof should not be limited based on the described embodiments. Rather, the semiconductor memory apparatus and operating method thereof described herein should only be limited in light of the claims that follow when taken in conjunction with the above description and accompanying drawings.

What is claimed is:

1. A semiconductor memory apparatus including:
   a write driver coupled to one end of a memory cell, and configured to provide the memory cell with a program current based on write data;
   a transition detection circuit coupled to the other end of the memory cell, and configured to generate a detection signal by comparing one of a current flowing through the memory cell and a voltage level of a global word line coupled to the memory cell with a reference value; and
   a voltage adjustment circuit configured to adjust the voltage level of the global word line based on the detection signal,
   wherein the voltage adjustment circuit provides one of a variable bias voltage and a power bias voltage to the global word line in response to the detection signal, adjusts the level of the variable bias voltage based on the write data, and further adjusts the level of the variable bias voltage based on an address signal or temperature information.

2. The semiconductor memory apparatus of claim 1, wherein the memory cell includes:
   a phase-change element coupled to the write driver at one end thereof; and
   a switching element coupled at one end thereof to the other end of the phase-change element, and at the other end thereof to the global word line, the switching element being an ovonic threshold switch.

3. The semiconductor memory apparatus of claim 2, further comprising:
a column switch coupled to a bit line, and configured to couple a global bit line to the bit line based on a column selection signal; and
a row switch coupled to a word line, and configured to couple the other end of the switching element to the global word line when the word line is enabled.

4. The semiconductor memory apparatus of claim 2, wherein the transition detection circuit enables the detection signal when the current flowing through the memory cell is greater than the reference value, and disables the detection signal when the current flowing through the memory cell is smaller than the reference value.

5. The semiconductor memory apparatus of claim 2, wherein the reference value corresponds to one of a predetermined voltage level and a threshold current value capable of turning on the switching element.

6. The semiconductor memory apparatus of claim 1, wherein, when the write data is set data, the voltage adjustment circuit generates, as the variable bias voltage, a higher voltage than the voltage level of the variable bias voltage generated when the write data is reset data.

7. The semiconductor memory apparatus of claim 1, wherein the voltage adjustment circuit applies the variable bias voltage at a lower level to the memory cell located remotely from the write driver, and applies the variable bias voltage at a higher level to the memory cell located near the write driver, based on the address signal.

8. The semiconductor memory apparatus of claim 1, wherein the voltage adjustment circuit decreases the level of the variable bias voltage when a temperature of the semiconductor memory apparatus is low and, increases the level of the variable bias voltage when the temperature of the semiconductor memory apparatus is high, based on the temperature information.

9. The semiconductor memory apparatus of claim 1, wherein the voltage adjustment circuit includes:
a variable bias voltage generator configured to generate the variable bias voltage based on the write data;
a global word line voltage switch configured to output one of the variable bias voltage and the power bias voltage in response to the detection signal; and
a buffer configured to buffer an output of the global word line voltage switch, and provide the global word line with the buffered voltage.

10. The semiconductor memory apparatus of claim 9, wherein the voltage adjustment circuit further includes a power switch configured to provide a bulk bias voltage as the power bias voltage during an active mode of the semiconductor memory apparatus, and provide a ground voltage as the power bias voltage during a standby mode of the semiconductor memory apparatus.

11. The semiconductor memory apparatus of claim 10, wherein the bulk bias voltage and the variable bias voltage have negative levels, and the variable bias voltage has a level between those of the ground voltage and the bulk bias voltage.

12. An operating method of a semiconductor memory apparatus including a memory cell, the operating method comprising:
providing a global word line with a power bias voltage during an active mode of the semiconductor memory apparatus;
providing a program current to the memory cell based on write data; and
adjusting a voltage level of the global word line based on a current flowing through the memory cell and the voltage level of the global word line,
wherein a bulk bias voltage is provided as the power bias voltage during the active mode, and a ground voltage is provided as the power bias voltage during a standby mode of the semiconductor memory apparatus.

13. The operating method of claim 12, wherein adjusting the voltage level of the global word line includes increasing the voltage level of the global word line when the current flowing through the memory cell is greater than a reference value or when the voltage level of the global word line is greater than the reference value.

14. The operating method of claim 13, wherein increasing the voltage level of the global word line includes providing the global word line with a variable bias voltage having a higher level than that of the power bias voltage.

15. The operating method of claim 14, further comprising adjusting the level of the variable bias voltage based on the write data.

16. The operating method of claim 15, further comprising further adjusting the level of the variable bias voltage based on information on a location of the memory cell and a temperature of the semiconductor memory apparatus.

* * * * *